United States Patent [19]
Hopper et al.

[11] Patent Number: 6,136,729
[45] Date of Patent: Oct. 24, 2000

[54] METHOD FOR IMPROVING SEMICONDUCTOR DIELECTRICS

[75] Inventors: Dawn M. Hopper, San Jose; Richard J. Huang, Cupertino; Lu You, Santa Clara, all of Calif.

[73] Assignee: Advanced Micro Devices, Inc., Sunnyvale, Calif.

[21] Appl. No.: 09/133,042

[22] Filed: Aug. 12, 1998

[51] Int. Cl.[7] .................................................. H01L 21/31
[52] U.S. Cl. ...................... 438/778; 438/779; 438/780; 438/781; 438/618; 438/670; 438/637
[58] Field of Search .................... 438/778, 779, 438/780, 781, 618, 670, 637

[56] References Cited

U.S. PATENT DOCUMENTS 5,370,904  12/1994  Mine et al. ........................... 427/126.2
5,899,751  5/1999  Chang et al. ........................... 438/758
5,976,966  11/1999  Inoue ..................................... 438/618

*Primary Examiner*—David Nelms
*Assistant Examiner*—Quoc Hoang
*Attorney, Agent, or Firm*—Mikio Ishimaru

[57] ABSTRACT

An ultra-large scale integrated circuit is manufactured by using silicon-based, low dielectric materials on a wafer in which the hydrophobic nature of the dielectric materials is improved by relative low temperature heating in a vacuum or inert atmosphere, slowly increasing the wafer temperature to the hard bake temperature at a predetermined ramp rate, and heating the wafer at the hard bake temperature for a predetermine amount of time. As a result, the dielectric material can repel wet etch chemicals and minimize the formation of holes in the dielectric materials due to etching by wet etch chemicals.

34 Claims, 3 Drawing Sheets

METHOD FOR IMPROVING SEMICONDUCTOR DIELECTRICS

TECHNICAL FIELD

The present invention relates generally to semiconductor manufacturing and more specifically to integrated circuit manufacturing using silicon-based, dielectric materials.

BACKGROUND ART

Silicon compounds, such as silicon dioxide, that can be used as coatings are particularly valuable on electronic substrates. Such coatings serve as protective coatings, inter-level dielectric layers, doped dielectric layers to produce transistor-like devices, multilayer devices, etc.

Unfortunately, development of high integration and high-density very large-scale integrated circuits has progressed so rapidly that earlier silicon compounds have become less than satisfactory. The combination of high density and submicron geometries has lead to the surfaces of semiconductor substrates having relatively large protrusions and depressions with small spaces in between. This has posed serious problems for fabrication technology because of the difficulty of providing uniform depositions and subsequently planarizing such surfaces. One answer has been to use dielectrics which are deposited in liquid form. By spinning on dielectric films in a liquid form on a silicon substrate followed by a series of soft bakes and a hard bake to cause solvent evaporation, a high degree of uniformity and planarization have been achievable.

The soft bakes are performed on three different heating elements with a robot arm moving the silicon substrates from one heating element to another. The dielectric film-coated silicon substrates are soft baked by heating in air with a nitrogen purge at 150° C., 200° C., and 350° C. for 60 seconds each. This prevents curing of the dielectric film before the solvent evaporates. A hard bake at 400° C. for an hour cures the dielectric film.

The materials that have been used for the spun on dielectric films have included various organic silicon compounds in liquid solvents. These organic silicon compounds have included TBOS (tetraethoxysilane), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), and SOP (trimethylsilil phosphate). And the fluid carrier would be a solvent such as MIBK (methyl isobutyl ketone). One of the more commonly used silicon-based, low dielectric constant materials is HSQ (hydrogen silsesquioxane) in MIBK solvent.

Subsequent to the hard bake, a layer of a second dielectric material, typically an oxide material, is deposited over the cured dielectric film to form a cap layer. The layer of oxide material is generally deposited by a chemical vapor deposition (CVD) process. In a conventional thermal CVD process, reactive gases are supplied to the dielectric-film coated silicon substrate surface where heat-induced chemical reactions take place to produce a desired oxide layer. The oxide mats that are suitable for this application include silane oxide and TEOS (tetra ethyl ortho silicate).

After the deposition of the oxide layer over the silicon substrate, a layer of photoresist material is deposited over the oxide layer. Then, a conventional photolithographical masking process is used to pattern the photoresist layer so as to expose regions of the oxide layer that are directly over selected metal regions on the silicon substrate. Typically, an isotropic wet etch process is then used to create a wineglass shape opening in the oxide film. The materials that have been for the wet etch process have included various chemicals such as ammonium fluoride or acetic acid.

Thereafter, an anisotropic dry etching process is used to make another opening through the wineglass shape openings, the remaining oxide film and the dielectric film, to expose the selected metal regions on the silicon substrate. The dry etching processes could be plasma or reactive ion etching.

A major problem is that oxide films deposited by CVD have various defects, such as pinholes. Chemicals used in the wet etch process may propagate through these pinholes and reach the underlying dielectric film. Wet etch chemicals generally have significantly higher etch rate for dielectric films such as HSQ, than for the denseroxide films. As a result, large portions of the dielectric film may be etched away, leaving big holes in the dielectric film. These big holes are undesirable because they may lead to short circuit defects. For example, in a subsequent contact fill process wherein a contact metal is deposited through the openings onto the metal regions on the silicon substrate, these holes may be filled with the contact metal causing short circuit between adjacent metal regions.

The problem associated with big holes in dielectric films due to wet etch chemical propagation has been recognized and attempts have been made to remedy this problem. One approach was to increase the thickness of the oxide film. However, it slows down the manufacturing process and increases the cost of the operation. Another approach was to improve the process of forming the CVD oxide film by rotating the silicon substrate during the CVD process to form many layers of oxide films with different structural orientations. With this process, it was believed that it would be less probable that pinholes in one layer would be aligned with pinholes in the adjacent layers making it more difficult for the wet etch chemicals to propagate through the pinholes in the oxide films into the dielectric film. However, rotating the silicon substrate during the deposition was expensive and proved difficult to implement because it required significant modification to the CVD process equipment.

A manufacturing method of producing a silicon-based, dielectric material that is more resistant to wet etch chemicals has long been sought but has eluded those skilled in the art.

DISCLOSURE OF THE INVENTION

The present invention provides a method of manufacturing improved integrated circuits by improving the hydrophobic nature of a silicon-based, dielectric material coating on semiconductor wafers by relatively low temperature heating in a vacuum or inert atmosphere.

The present invention provides a method of manufacturing improved integrated circuits by improving the resistance to wet etch chemicals in a silicon-based, dielectric material coating on semiconductor wafers by relatively low temperature heating in a vacuum or inert atmosphere, slowly increasing the semiconductor wafer temperature to the hard bake temperature at a predetermined ramp rate, and then heating the semiconductor wafer at the hard bake temperature for a predetermined amount of time to cure the silicon-based, dielectric material.

The present invention provides a method of manufacturing improved integrated circuits which improve the retention of SiH content in silicon-based, dielectric coatings.

The present invention further provides a method of manufacturing improved integrated circuits using silicon-based, dielectric coatings without the formation of large holes due to etching by wet etch chemicals.

The present invention still further provides a method of manufacturing improved integrated circuits using silicon-based, dielectric coatings having a high SiH content after curing, making the coatings more resistant to etching by wet etch chemicals.

The present invention even further provides a method of manufacturing improved integrated circuits which have less defects.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
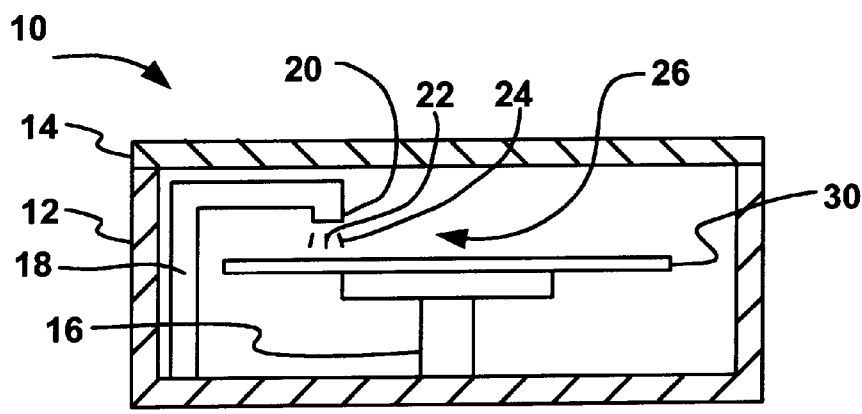
FIG. 1 is a cross-section of a spin-on coating machine for semiconductor wafers.

Referring now to FIG. 1, therein is shown a dielectric material application system 10 which generally consists of a housing 12 with a cover 14. Inside the dielectric material application system 10, which is shown as a simplified schematic, there is a rotatable vacuum chuck 16 and a dielectric material supply system 18.

The dielectric material supply system 18 has a nozzle 20 shown with a silicon-based dielectric material 22 in a liquid solvent 24 being dispensed. Although any of the dielectric materials named in the Background Art may be dispensed, in the best mode, the material is HSQ (hydrogen silsesquioxane) in MIBK (methyl isobutyl ketone) which is designated as dielectric material fluid 26. The rotatable vacuum chuck 16 holds wafers 30 by application of vacuum and spins the wafers 30.

During spinning, the dielectric material fluid 26 is dispensed onto the top surface of the wafer 30. The spinning assures complete coverage of the wafer and helps in controlling the thickness of the dielectric fluid 26 on the wafer 30.

Figure 2:
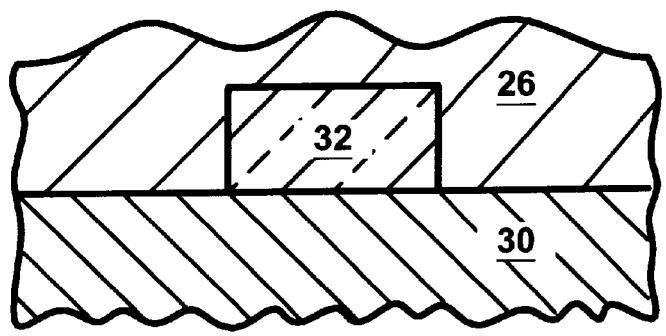
FIG. 2 is the cross-section of an improved integrated circuit with the spun-on silicon-based, dielectric material coating.

Referring now to FIG. 2, therein is shown the dielectric fluid 26 after spinning but before gravity and surface tension causes it to settle and to conform to a uniform thickness on the wafer 30 and over metal line 32 of the semiconductor device.

In manufacturing, the dielectric material application system 10 of FIG. 1 is used to coat the silicon wafer 30 with dielectric material fluid 26. When the wafer 30 is placed onto the rotatable vacuum chuck 16, a vacuum is applied to hold the wafer 30 in place. The wafer 30 is then spun up to speed and the nozzle 20 dispenses the dielectric material fluid 26 on to the top surface of the wafer 30. The thickness maybe controlled by the speed of the spin, position of the nozzle 20, the amount of fluid dispensed, and/or the ratio of dielectric material 22 to solvent 24.

Figure 3:
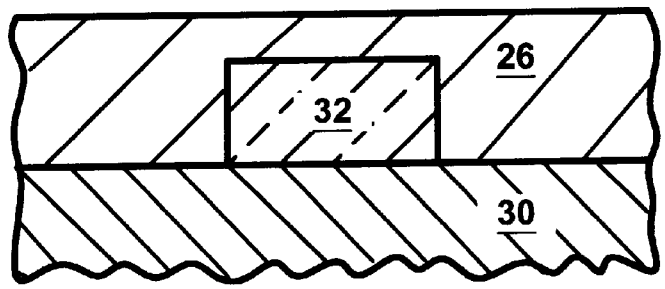
FIG. 3 is the cross-section of an improved integrated circuits with the spun-on silicon-based, dielectric material coating after the coating has settled and conformed to a uniform thickness.

Immediately after the coating of the wafer 30, the dielectric material fluid 26 will at first parallel the surface of the wafer 30 and the tops of the metal line 32 as shown in FIG. 2. Subsequently, the dielectric material fluid 26 will form a uniform film over the surface of the wafer 30 and thin out over the metal line 32 as shown in FIG. 3.

In the prior art (not shown), there was a plurality of cylindrical heating elements, generally three, upon which the wafer 30 would be deposited by a robot arm for "soft bake". The wafer 30 would be heated in air with a nitrogen purge by resting on the heating elements for 60 seconds at 150° C., 200° C., and 350° C. before being put into a furnace which is preheated to 400° C. The wafer would be heated for about an hour at 400° C. for a "hard bake".

Figure 4:
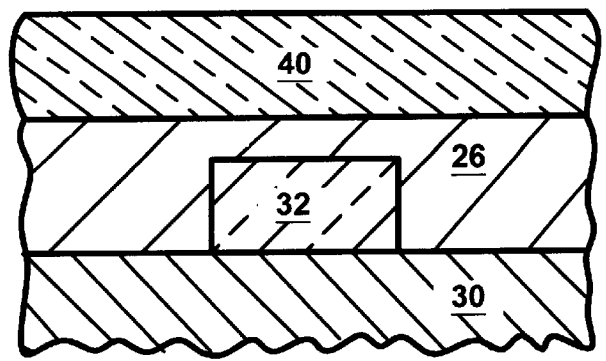
FIG. 4 is the cross-section of FIG. 3 with a layer of oxide material over the silicon-based dielectric material.

Subsequent to the hard bake, a layer of a second dielectric material, typically an oxide material 40, is deposited using a CVD process over the cured dielectric film 26 to form a cap layer as shown in FIG. 4.

Figure 5:
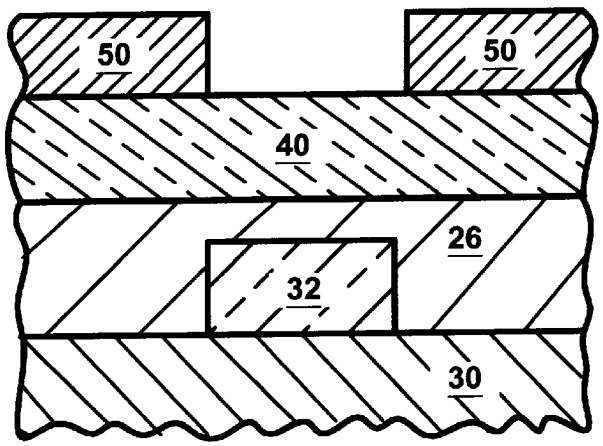
FIG. 5 is the cross-section of FIG. 4 with a patterned photoresist layer over the layer of oxide material.

Referring now to FIG. 5, therein is shown a patterned photoresist layer 50 over the oxide film 40 after a conventional photolithographical masking process. The patterned photoresist layer 50 exposes the portion of the oxide film 40 which is located directly above the underlying metal line 32.

Figure 6:
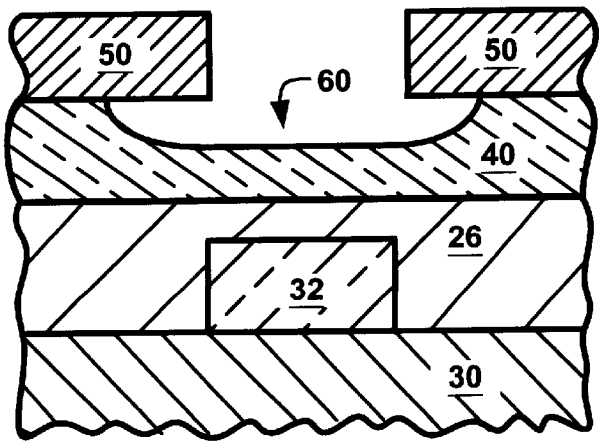
FIG. 6 is the cross-section of FIG. 5 with a wineglass shape opening in the oxide materials.
Figure 7:
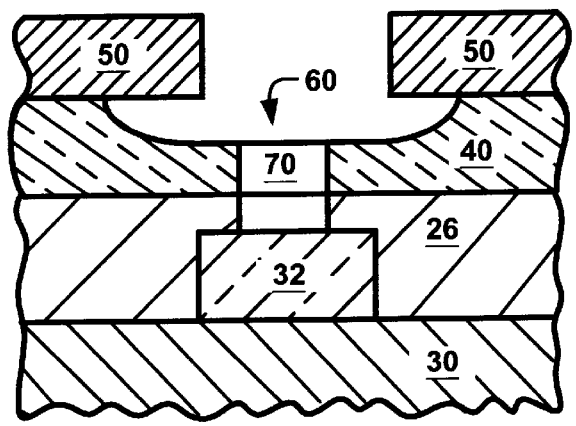
FIG. 7 is the cross-section of FIG. 6 with another opening through the wineglass shape opening in the oxide material.

After the photolithographical masking process, an isotropic wet etch process is used to create a wine-glass shape opening 60 in the oxide film as shown in FIG. 6. Thereafter, an anisotropic dry etching process is used to make another opening 70 through the wine-glass shape opening, the remaining oxide film 40 and the dielectric film 26, to expose the metal line 32 on the wafer 30 as shown in FIG. 7.

Figure 8:
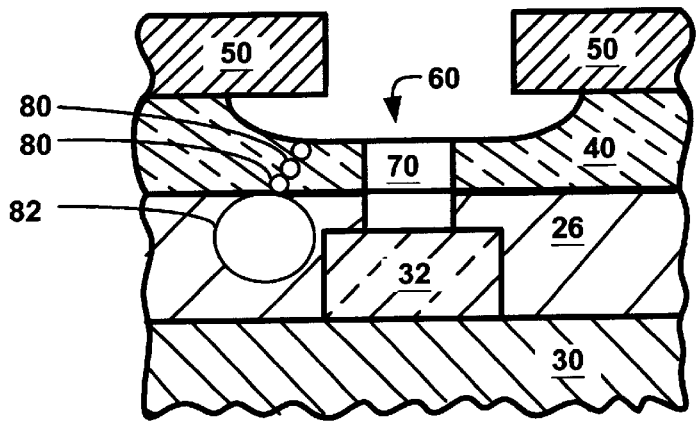
FIG. 8 is the cross-section of FIG. 7 showing pinholes in the oxide material and a big hole in the silicon-based dielectric material coating.

Referring now to FIG. 8, therein is shown defects, such as pinholes 80, typically found in oxide films deposited by a CVD process. As explained in the Background Art, chemicals used in the wet etch process generally have a significantly higher etch rate for dielectric films such as HSQ, than for the oxide films. As a result, large portions of the a dielectric film 26 will be etched away when wet etch chemicals propagate through pinholes 80 to the dielectric film 26. As a result, a big hole 82 is formed in dielectric film 26. These big holes 82 are undesirable because they may be filled with metal in a subsequent metal deposition process and lead to short circuit defects between metal lines.

In the present invention, the hydrophobic nature of the dielectric film 26 is improved to increase the ability of the dielectric film 26 to repel the wet etch chemicals that may propagate through pinholes 80 in the oxide film 40 to the dielectric film 26 and thus minimize the formation of big holes in the dielectric film 26. The hydrophobic nature of the dielectric film 26 may be controlled by controlling the percentage of silicon hydride (SiH %) remaining in the dielectric film 26 after the film is cured. The SiH % remaining is a ratio of the amount of SiH remaining after cure and the amount of SiH before cure. The dielectric film 26 becomes more hydrophobic as its SiH % remaining after cure increases. It is found that when the SiH % remaining after cure is at least around 80%, the hydrophobic nature of the dielectric film 26 will be sufficient to repel the wet etch chemicals and minimize the formation of the big holes 82 in the dielectric film 26.

In a conventional curing process where the wafer 30 is heated at around 400° C. during the entire hard bake, the SiH % remaining after cure is only around 70% which does not provide an adequate hydrophobic nature in the dielectric film 26 to repel the wet etch chemicals.

The present invention maximizes the SiH % remaining in the dielectric film after cure by preventing SiH in the film from converting into SiOH. In the present invention, after the conventional soft bake steps, the dielectric film 26 is cured in the absence of oxygen; and the hard bake is started from a lower temperature. The temperature of the wafer is then increased slowly to the hard bake temperature of around 400° C. so as to drive off moisture present on the surface of the dielectric film 26 and prohibit oxygen present in the moisture from thermally reacting to convert SiH to SiOH.

Figure 9:
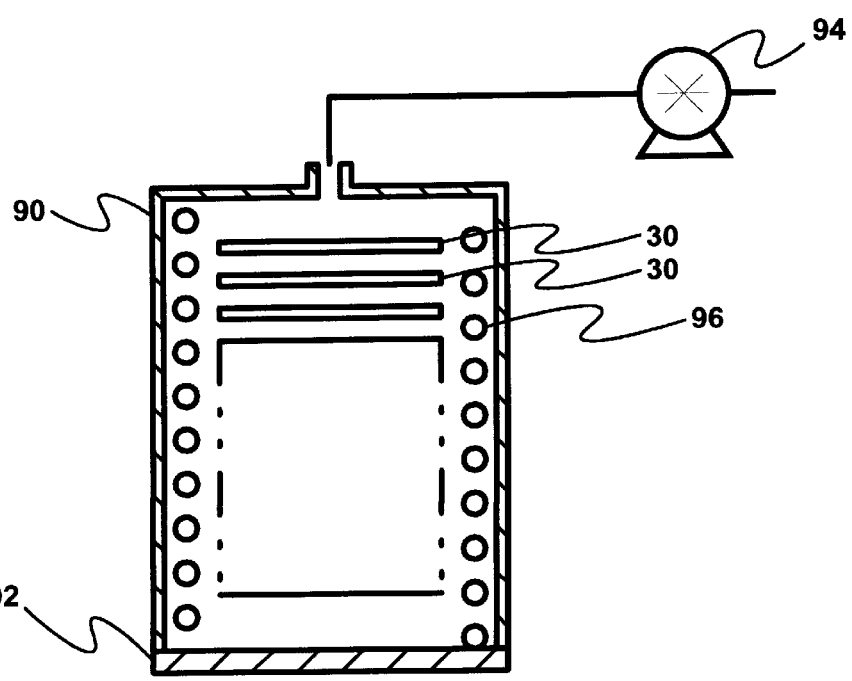
FIG. 9 is the cross-section of a vacuum oven used in the present invention.

Referring now to FIG. 9, therein is shown a chamber 90 on a sealing surface 92. The chamber 90 can contain an inert gas such as nitrogen or argon, or may be connected to a vacuum pump 94 which provides a moderate level of vacuum in the milli-torr range ($10^{-3}$ torr) or above. In the best mode the chamber 90 contains nitrogen.

The chamber 40 also contains heating elements 96 which can uniformly heat the wafers 30 to temperatures around 400° C.

The inside of the chamber 40 can then be filled with an inert atmosphere such as nitrogen or argon to displace ambient atmosphere which contains reactive oxygen. This would prevent the SiH in the dielectric films 26 on wafers 30 from reacting under subsequent heating with the atmospheric oxygen to form SiOH which would reduce the SiH % remaining after cure.

In the best mode, the chamber 40 would be pumped down to a mild vacuum in the milli-torr range, preferably $15 \times 10^{-3}$ torr or harder, and then purged with nitrogen.

In the present invention, the wafers 30 would first be heated to about 300° C. to about 375° C. in the absence of oxygen. The wafer 30 would then be heated slowly to the hard bake temperature of about 400° C. The rate of change of the wafer temperature is known as "ramp rate". The ramp rate of the rising temperature is less than about 10° C. per minute and more than about 1° C. per minute. As the temperature of the wafer 30 approaches the hard bake temperature, the ramp rate will be reduced to ensure that the wafer temperature will be settled at a temperature that is close to about 400° C. and yet not higher than about 400° C. By starting the curing from a lower temperature, that is, at about 300° C. to about 375° C., moisture on the surface of the dielectric film will be driven off which will avoid the oxygen in the moisture from thermally reacting with the SiH in the dielectric film 26 to form SiOH. The wafer 30 would then be heated slowly to the hard bake temperature of about 400° C. and be maintained at that temperature for about an hour, and preferably between forty-five minutes and an hour and fifteen minutes. The objective would be to have a high enough temperature that the solvent and water in the dielectric material fluid 26 would be slowly evaporated out and that any entrapped oxygen would combine to form water which would also be slowly evaporated out. At the same time the temperature would be low enough to prevent the conversion of the silicon in the silicon based material from being converted into high dielectric silicon dioxide. The time should be long enough for the evaporation process to occur and cross linking of the molecules into large chain polymetrics. The time should also be too short to permit significant densification of the dielectric material 26 to occur which would undesirably increase the dielectric constant.

After the hard bake at about 400° C., the wafer 30 would then be cooled down. The ramp rate of the falling temperature is at about 10° C. per minute.

It should be noted that the SiH % remaining after cure using the manufacturing steps of the present invention is at least around 80%. Thus the hydrophobic nature of the dielectric film 26 would be sufficient to repel the wet etch chemicals. As a result, the formation of large holes in the dielectric film 26 due to wet etch chemicals propagating through overlaying oxide layer will be minimized. Accordingly, integrated circuits with fewer defects can be manufactured.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing a semiconductor wafer comprising the steps of: depositing a silicon-based, dielectric material on to the semiconductor wafer; removing oxygen from around the semiconductor wafer with said silicon-based, dielectric material deposited thereon;
    heating the semiconductor wafer with said silicon-based, dielectric material in the
  absence of oxygen to a first temperature;
    heating the semiconductor wafer with said silicon-based, dielectric material in the absence of oxygen from said first temperature to a second temperature which is above said first temperature and below the temperature at which said silicon-based, dielectric material is oxidized into silicon dioxide, wherein the step of heating said silicon-based, dielectric material in the absence of oxygen from said first temperature to said second temperature is performed with a ramp rate of less than about 10° C. per minute; and
    heating the semiconductor wafer with said silicon-based, dielectric material in the absence of oxygen at said second temperature.

2. The method as claimed in claim 1, wherein the step of depositing said silicon-based, dielectric material further comprises heating said silicon-based, dielectric material at a third temperature above the temperature at which said solvent evaporates, said third temperature is below said first temperature.

3. The method as claimed in claim 1 wherein the step of: removing oxygen includes the step of vacuum pumping.

4. The method as claimed in claim 1 wherein the step of: removing oxygen includes the step of replacing the oxygen with an inert gas.

5. The method as claimed in claim 1 wherein the step of: removing oxygen includes the step of replacing the oxygen with nitrogen.

6. The method as claimed in claim 1 wherein said silicon-based, dielectric material comprises an amount of SiH immediately prior to the step of heating the semiconductor wafer with said silicon-based, dielectric material in the absence of oxygen at said first temperature and said silicon-based, dielectric material comprises at least 80% of said amount of SiH immediately after the step of heating the semiconductor wafer with said silicon-based, dielectric material in the absence of oxygen at said second temperature.

7. The method as claimed in claim 1 wherein the step of heating said silicon-based, dielectric material in the absence of oxygen from said first temperature to said second temperature is performed with a ramp rate of more than about 1° C. per minute.

8. The method as claimed in claim 1 wherein said first temperature is between about 300° C. to about 375° C.

9. The method as claimed in claim 1 wherein said second temperature is at about 400° C.

10. The method as claimed in claim 1 wherein the step of depositing said silicon-based, dielectric material is done by dissolving said material in a solvent and spinning said material and solvent on to the semiconductor wafer.

11. A method for manufacturing a semiconductor wafer comprising the steps of:

depositing an organic silicon-based, dielectric material in a liquid solvent on to the semiconductor wafer;

removing oxygen from around the semiconductor wafer with said organic silicon-based, dielectric constant material deposited thereon;

heating the semiconductor wafer with said organic silicon-based, dielectric constant material in the absence of oxygen to a first temperature above the temperature at which said solvent evaporates;

heating the semiconductor wafer with said organic silicon-based, dielectric constant material in the absence of oxygen from said first temperature to a second temperature which is above said first temperature and below the temperature at which said organic silicon-based, dielectric material is oxidized into silicon dioxide, wherein the step of heating said organic silicon-based, dielectric material in the absence of oxygen from said first temperature to said second temperature is performed with a ramp rate of less than about 110° C. per minute; and heating the semiconductor wafer with said organic silicon-based, dielectric material in the absence of oxygen at said second temperature.

12. The method as claimed in claim 11 wherein the step of:

removing oxygen includes the step of vacuum pumping.

13. The method as claimed in claim 11 wherein the step of:

removing oxygen includes the step of replacing the oxygen with nitrogen gas.

14. The method as claimed in claim 11 wherein the step of:

removing oxygen includes the step of replacing the oxygen with argon gas.

15. The method as claimed in claim 11 wherein said organic silicon-based, dielectric material comprises an amount of SiH immediately prior to the step of heating the semiconductor wafer with said organic silicon-based, dielectric material in the absence of oxygen at said first temperature and said organic silicon-based, dielectric material comprises at least 80% of said amount of SiH immediately after the step of heating the semiconductor wafer with said organic silicon-based, dielectric material in the absence of oxygen at said second temperature.

16. The method as claimed in claim 11 wherein the step of heating said organic silicon-based, dielectric material in the absence of oxygen from said first temperature to said second temperature is performed with a ramp rate of more than about 1° C. per minute.

17. The method as claimed in claim 1 wherein said first temperature is between about 300° C. to about 375° C.

18. The method as claimed in claim 11 wherein said second temperature is at about 400° C.

19. The method as claimed in claim 11 wherein the step of depositing said organic silicon-based, dielectric material in said liquid solvent further comprises heating said organic silicon-based, dielectric material in said liquid solvent in air at a third temperature above the temperature at which said solvent evaporates, said third temperature is below said first temperature.

20. The method as claimed in claim 11 including the step of:

depositing a second dielectric material on to the semiconductor wafer with said organic silicon-based, dielectric material using a chemical vapor deposition process.

21. The method as claimed in claim 20 wherein said second dielectric material comprises an oxide.

22. The method as claimed in claim 11 wherein said organic silicon-based, dielectric material is selected from the group consisting of: tetraethoxysilane, tetramethoxysilane, octamethyleyclotetrasiloxane, hexamethyldisiloxane, trimethylsilil borxle, diaceloxyditerliarybutoxsilane, trimethylsilil phosphate, and hydrogen silsesquioxane.

23. The method as claimed in claim 11 wherein the step of depositing said organic silicon-based, dielectric material in a solvent on to the semiconductor wafer is done by a spinning process.

24. A method for manufacturing a semiconductor wafer comprising the steps of:

depositing hydrogen silsesquioxane in methyl isobutyl ketone on to the semiconductor wafer by a spinning process;

removing oxygen from a chamber around the semiconductor wafer with said hydrogen silsesquioxane in methyl isobutyl ketone thereon;

heating the semiconductor wafer with said hydrogen silsesquioxane in methyl isobutyl ketone in the absence of oxygen in said chamber to a temperature above the temperature at which said methyl isobutyl ketone in said hydrogen silsesquioxane evaporates;

heating the semiconductor wafer with said hydrogen silsesquioxane in methyl isobutyl ketone in the absence of oxygen in said chamber from said first temperature to a second temperature which is above said first temperature and below the temperature at which said hydrogen silsesquioxane is oxidized into silicon dioxide, wherein the step of heating said hydrogen silsesquioxane in the absence of oxygen from said first temperature to said second temperature is performed with a ramp rate of less than about 10° C. per minute; and heating the semiconductor wafer with said hydrogen silsesquioxane in the absence of oxygen at said second temperature.

25. The method as claimed in claim 24 wherein the step of:

removing oxygen includes the step of vacuum pumping said chamber to at least $10^{-3}$ torr.

26. The method as claimed in claim 24 wherein the step of:

removing oxygen includes the step of replacing the oxygen in said chamber with nitrogen gas.

27. The method as claimed in claim 24 wherein the step of:

removing oxygen includes the step of replacing the oxygen in said chamber with argon gas.

28. The method as claimed in claim 24 wherein said hydrogen silsesquioxane material comprises an amount of SiH immediately prior to the step of heating the semiconductor wafer with hydrogen silsesquioxane in the absence of oxygen at said first temperature and said hydrogen silsesquioxane comprises at least 80% of said amount of SiH immediately after the step of heating the semiconductor wafer with said hydrogen silsesquioxane in the absence of oxygen at said second temperature.

29. The method as claimed in claim 24 wherein the step of heating said hydrogen silsesquioxane in the absence of oxygen from said first temperature to said second temperature is performed with a ramp rate of more than about 1° C. per minute.

30. The method as claimed in claim 24 wherein said first temperature is between about 300° C. to about 375° C.

31. The method as claimed in claim 24 wherein said second temperature is at about 400° C.

32. The method as claimed in claim 24 wherein the step of depositing said hydrogen silsesquioxane in methyl isobutyl ketone further comprises heating said hydrogen silsesquioxane in methyl isobutyl ketone at about 150° C., 200° C., and 350° C. for about 60 seconds each.

33. The method as claimed in claim 24 including the step of:

depositing a second dielectric material on to the semiconductor wafer with said organic silicon-based, dielectric material using a chemical vapor deposition process.

34. The method as claimed in claim 33 wherein said second dielectric material comprises an oxide.

* * * * *